(12) United States Patent
Park et al.

(10) Patent No.: US 11,223,030 B2
(45) Date of Patent: Jan. 11, 2022

(54) ORGANIC EMITTING DISPLAY DEVICE HAVING REFLECTIVE METAL LAYERS ON DIFFERENT LEVELS ABOVE RED, GREEN AND BLUE PIXEL REGIONS AND METHOD OF MANUFACTURING SAME

(71) Applicant: DB HiTek Co., Ltd., Seoul (KR)

(72) Inventors: Dong-Hoon Park, Gyeonggi-do (KR); Dae-Il Kim, Chungcheongbuk-do (KR); Young-Jin Kim, Seoul (KR); Hye-Rim Eun, Daegu (KR)

(73) Assignee: DB HiTek Co., Ltd., Seoul (KR)

( * ) Notice: Subject to any disclaimer, the term of this patent is extended or adjusted under 35 U.S.C. 154(b) by 23 days.

(21) Appl. No.: 15/930,327

(22) Filed: May 12, 2020

(65) Prior Publication Data

US 2021/0280830 A1    Sep. 9, 2021

(51) Int. Cl.
*H01L 51/52* (2006.01)
*H01L 27/32* (2006.01)
*H01L 51/56* (2006.01)
*H01L 51/00* (2006.01)

(52) U.S. Cl.
CPC ...... *H01L 51/5265* (2013.01); *H01L 27/3211* (2013.01); *H01L 27/3244* (2013.01); *H01L 51/0017* (2013.01); *H01L 51/5206* (2013.01); *H01L 51/56* (2013.01)

(58) Field of Classification Search
CPC ............. H01L 51/5265; H01L 27/3211; H01L 27/3244; H01L 51/0017; H01L 51/5206; H01L 51/56
See application file for complete search history.

(56) References Cited

U.S. PATENT DOCUMENTS

| | | | |
|---|---|---|---|
| 2006/0017377 A1* | 1/2006 | Ryu | H01L 51/5265 313/504 |
| 2006/0138945 A1* | 6/2006 | Wolk | H01L 51/5265 313/506 |
| 2012/0299037 A1* | 11/2012 | Lee | H01L 51/5206 257/98 |
| 2013/0105773 A1* | 5/2013 | Kim | H01L 27/3251 257/40 |
| 2021/0050387 A1* | 2/2021 | Kim | H01L 27/3258 |
| 2021/0143367 A1* | 5/2021 | Ichikawa | H01L 27/322 |

FOREIGN PATENT DOCUMENTS

KR    10-2015-0038982 A    4/2015

* cited by examiner

*Primary Examiner* — Michael Jung
(74) *Attorney, Agent, or Firm* — Andrew D. Fortney; Central California IP Group, P.C.

(57) ABSTRACT

An organic light emitting display device in which a sidewall of a reflective metal layer in a blue pixel region is covered with an inorganic film and in which the reflective metal layer is thus prevented from being damaged or rendered defective when performing subsequent processes, such as etching and cleaning, for forming an anode on the reflective metal layer.

10 Claims, 8 Drawing Sheets

ORGANIC EMITTING DISPLAY DEVICE HAVING REFLECTIVE METAL LAYERS ON DIFFERENT LEVELS ABOVE RED, GREEN AND BLUE PIXEL REGIONS AND METHOD OF MANUFACTURING SAME

CROSS REFERENCE TO RELATED APPLICATION

The present application claims priority to Korean Patent Application No. 10-2020-0026948, filed Mar. 4, 2020, the entire contents of which are incorporated herein for all purposes by this reference.

BACKGROUND OF THE INVENTION

Field of the Invention

The present invention relates to an organic light emitting display device. More particularly, the present invention relates to an organic light emitting display device, in which a reflective metal in a blue pixel region has a sidewall that is covered with an inorganic film. Thus, damage to and/or defects in the reflective metal may be reduced or prevented during subsequent processes, such as etching and cleaning when forming an anode on the reflective metal.

Description of the Related Art

In the information age, in recent years, much progress has been made in display technologies for visually expressing electrical information signals. A variety of ever-increasingly thin and lightweight display devices that achieve low power consumption have been developed. Examples of such flat display devices include a liquid crystal display (LCD) device, a plasma display panel (PDP) device, a field emission display (FED) device, an organic light emitting display (OLED) device, and so on.

Particularly, the organic light emitting display device, as an element that itself emits light, has the advantages of being higher in response speed, light emitting efficiency, and luminance, and having a wider viewing angle than other flat display devices. Organic light emitting display devices can realize a large-sized, high-definition resolution screen, and thus, are highly recognized as next-generation display devices. In an organic light emitting display device, an organic light emitting layer is formed between two electrodes (i.e., an anode and a cathode).

Electrons and holes are injected from the two electrodes into an organic light emitting layer, and thus an exciton is generated by a combination of the electron and the hole. Then, the exciton emits light when it changes from an excited state (as generated) to a ground state.

FIGS. 1 and 2 are reference diagrams for describing damage to or loss of a reflective metal in a blue pixel region when manufacturing an organic light emitting display device in the related art.

In steps of manufacturing the organic light emitting diode 900 in the related art, a first reflective metal 910 in a red pixel region R, a second reflective metal 920 in a green pixel region G, and a third reflective metal 930 in a blue pixel region B have different heights or distances from a substrate (not shown). That is, the first reflective metal 910 is first formed, and the second reflective metal 920 is then formed at a greater distance from the substrate than the first reflective metal 910. Subsequently, the second reflective metal 920 is covered with an insulation film 940, and then the third reflective metal 930 is formed on the insulation film 940 in the blue pixel region B.

Specifically, for the formation of the third reflective metal 930, for example, an aluminum metal layer is deposited on the insulation film 940, is patterned and etched, and then cleaned. Subsequently, a titanium nitride (TiN) layer is deposited on the resulting structure, including the patterned third reflective metal 930. The TiN layer is then patterned and etched in such a manner that the resulting TiN layer 940 has substantially the same size as the third reflective metal 930, and is then cleaned. During these processes, when $Cl_2$, which is used to etch the TiN layer, reacts with $H_2O$, which is used to clean the third reflective layer and the TiN layer after etching, HCl is generated and thus, the third reflective metal 930 can be damaged or rendered defective. This can cause a decrease in the light emitting efficiency of the device itself.

In order to solve these problems, the present invention provides an organic light emitting display device with an improved structure and a method of manufacturing such an organic light emitting display device.

SUMMARY OF THE INVENTION

An objective of the present invention is to provide an organic light emitting display device and a method of manufacturing the organic light emitting display device, including a protective layer on an upper surface of a reflective metal layer in a blue pixel region that is patterned simultaneously with the reflective metal layer, thereby preventing formation of HCl that results from a chemical reaction between $Cl_2$, which may be used to etch the protective layer, and $H_2O$, which is used to clean the protective layer and the reflective metal layer after the etching thereof, and any subsequent erosion of the reflective metal layer from the HCl.

Another objective of the present invention is to provide an organic light emitting display device and a method of manufacturing the organic light emitting display device, including a protective layer on an upper surface of a reflective metal layer in a blue pixel region having the same material as an anode (e.g., in other pixel regions), so that the anode can be formed without removing the protective layer.

Still another objective of the present invention is to provide an organic light emitting display device and a method of manufacturing the organic light emitting display device, including a protective layer on an upper surface of a reflective metal layer in a blue pixel region, and an inorganic film, such as a silicon nitride film, is on exposed sidewalls of the reflective metal layer and the protective layer. In the method, the anode is formed after the inorganic film is formed on the sidewalls of the reflective metal layer and the protective layer. That is, since the anode is formed after the entire surface of the reflective metal layer in the blue pixel region is covered with the protective layer and the inorganic film, the reflective metal layer in the blue pixel region can be protected against reactive chemicals during subsequent processes.

Still another objective of the present invention is to provide an organic light emitting display device and a method of manufacturing the organic light emitting display device, including a protective layer having a relatively smaller thickness than a corresponding anode, so that the anode can be formed uninterruptedly without removing the protective layer.

Still another objective of the present invention is to provide an organic light emitting display device and a method of manufacturing the organic light emitting display device, in which the reflective metal layers in red, green, and blue pixel regions have different heights (or distances from the substrate) according to a microscopic resonance length, so that the light emitting efficiency can be improved.

Still another objective of the present invention is to provide an organic light emitting display device and a method of manufacturing the organic light emitting display device, including second protrusions in red and green pixel regions are at a predetermined distance away from each other, thereby preventing (structures in) the adjacent pixel regions from interfering with each other.

Embodiments of the present invention may have the following configurations for implementation.

According to an aspect of the present invention, there is provided an organic light emitting display device including an interlayer insulation film covering an upper metal layer on a lower insulation layer; a first reflective metal layer in a red pixel region on the interlayer insulation film; a first insulation layer on the first reflective metal layer and an exposed surface of the interlayer insulation film; a second reflective metal layer in a green pixel region on the first insulation layer; a second insulation layer on the second reflective metal layer and an exposed surface of the first insulation layer; a third reflective metal layer in a blue pixel region on the second insulation layer; and a cover film on a sidewall of the third reflective metal layer.

In the organic light emitting display device, the first insulation layer may include a first protrusion in the red pixel region protruding upward from the first reflective metal layer, and the second insulation layer may include second protrusions protruding upward from the first protrusion and the second reflective metal layer, respectively.

The organic light emitting display device may further comprise an anode on the second protrusions and an upper surface of the third reflective metal layer.

In the organic light emitting display device, each of the first to third reflective metal layers may include a buffer electrode and a metal layer on the buffer electrode, and the third reflective metal layer may comprise an aluminum material (e.g., elemental aluminum or a conventional conductive aluminum alloy).

In the organic light emitting display device, the first to third reflective metal layers may have different heights or distances from the lower insulation layer or an underlying substrate.

According to another aspect of the present invention, there is provided a method of manufacturing an organic light emitting display device, the method including depositing an interlayer insulation film on an upper metal layer in each pixel region, the upper metal layer being on a lower insulation film; forming a first reflective metal layer on the interlayer insulation film in a red pixel region; forming a first insulation layer on the first reflective metal layer and an exposed surface of the interlayer insulation film; forming a second reflective metal layer on the first insulation layer in a green pixel region; forming a second insulation layer on the second reflective metal layer and an exposed surface of the first insulation layer; forming a third reflective metal layer on the second insulation layer in a blue pixel region; and covering partially or wholly an exposed surface of the third reflective metal layer (e.g., with a protective film).

In the method, covering the third reflective metal layer covers an upper surface of the third reflective metal layer with a protective layer comprising a metal material.

The method may further include forming an anode on the protective layer on the upper surface of the third reflective metal layer. The protective layer and the anode may be the same material.

In the method, covering the reflective metal layer may cover a sidewall of the third reflective metal layer with the protective film.

In the method, an inorganic film layer may be deposited on the sidewall of the third reflective metal layer and an exposed surface of the second insulation layer, and then removing part of the inorganic film layer by anisotropic (e.g., reactive ion) etching.

According to still another aspect of the present invention, there is provided a method of manufacturing an organic light emitting display device, the method including depositing an insulation film on an upper metal layer in each pixel region, the upper metal layer being on a lower insulation film; forming a first reflective metal layer in a red pixel region, a second reflective metal layer in a green pixel region, and a third reflective metal layer in a blue pixel region having different heights by forming interlayer insulation films; covering an upper surface of the third reflective metal layer with a protective layer that is relatively higher than the first reflective metal layer and the second reflective metal layer; depositing an inorganic film layer on an upper exposed surface of the interlayer insulation film, the third reflective metal layer, and the protective layer; and forming a protective film on a sidewall of the third reflective metal layer by etching (e.g., anisotropically etching) the inorganic film layer.

The method may further include depositing a metal layer on the protective layer, the metal layer comprising a same material as the protective layer; and forming an anode by patterning and etching the metal layer.

In the method, the protective layer may have a smaller thickness than the anode.

In the method, forming the anode may comprise etching and cleaning the metal layer.

According to still another aspect of the present invention, there is provided a method of manufacturing an organic light emitting display device, the method including depositing an interlayer insulation film on an upper metal layer in each pixel region, the upper metal layer being on a lower insulation film; forming a first reflective metal layer on the interlayer insulation film in a red pixel region; forming a first insulation layer on the first reflective metal layer and an exposed surface of the interlayer insulation film such that a first protrusion protrudes upward from the first reflective metal layer; forming a second reflective metal layer on the first insulation layer in a green pixel region; forming a second insulation layer on the second reflective metal layer and an exposed surface of the first insulation layer such that second protrusions protrude upward from the first protrusion and the first reflective metal layer; forming a third reflective metal layer on the second insulation layer in a blue pixel region; and covering partially or wholly an exposed surface of the third reflective metal layer (e.g., with a protective film).

In the method, the first protrusion may be a predetermined horizontal distance away from the second reflective metal layer, and adjacent ones of the second protrusions may be a predetermined horizontal distance away from each other.

In the method, covering the third reflective metal layer may include forming a protective layer comprising a metal layer on an upper surface of the third reflective metal layer; depositing an insulation layer on the second insulation film, the third reflective metal layer, and an exposed surface of the metal layer; and forming a protective film on a sidewall of the third reflective metal layer by etching (e.g., anisotropically etching) the insulation layer.

The method may further include forming an anode, having a same material as the protective layer on the protective layer, after forming the protective film.

The present invention provides the following advantages that result from the configurations described above.

According to the present invention, a protective layer is formed together on an upper surface of a reflective metal layer when forming the reflective metal layer in a blue pixel region. This provides the advantage that HCl, which is generated as a result of a chemical reaction between $Cl_2$ (an etchant for etching a metal or other conductive material) and $H_2O$ (used when cleaning the reflective metal layer or the like), prevents the reflective metal layer from being damaged.

In addition, according to the present invention, the protective layer that is formed on an upper surface of a reflective metal layer in a blue pixel region comprises the same material as a corresponding anode. This provides the advantage that the anode may be formed on the protective layer without performing a separate process for removing the protective layer.

In addition, according to the present invention, the protective layer is formed on the upper surface of the reflective metal layer in a blue pixel region, then, for example, an inorganic film such as a silicon nitride film is deposited on the reflective metal layer and an exposed surface of the protective layer and is etched. This provides the advantages that the anode is formed after covering the sidewalls of the reflective metal layer and that, for protection against a reactive chemical material, the entire surfaces of the reflective metal layer are covered when performing subsequent processes.

In addition, according to the present invention, the protective layer has a relatively smaller thickness than a corresponding anode. This provides the advantage that the anode can be formed without interruption and without separately removing the protective layer.

In addition, according to the present invention, reflective metal layers in red, green, and blue pixel regions have different heights or distances from the substrate, according to a microscopic resonance length (e.g., of the pixel). This provides the advantage of improving the light emitting efficiency.

In addition, according to the present invention, second protrusions that are formed in red and green pixel regions are a predetermined distance away from each other. This provides the advantage of reducing or preventing interference between adjacent pixel regions.

On the other hand, notably, although not explicitly described in this section, actual and potential advantages that are realized or expected from technical features of the present invention in the following specification are regarded as being described in the specification of the present invention.

DETAILED DESCRIPTION OF THE INVENTION

Various modifications to embodiments of the present invention are possibly made. The scope of the present invention should not be construed as being limited to the following embodiments and should be construed by reference to what is claimed. In addition, the following embodiments herein are referentially provided in order for a person skilled in the art to get a full understanding of the present invention.

When one constituent element will be described below as being positioned "on" or "on top of" another constituent element, this means that one constituent element is brought into contact with an upper surface of another constituent element. Furthermore, when one constituent element will be described below as being positioned "above" or "over" another constituent element, this means that one constituent element is at some or predetermined distance away from another constituent element. Then, in a case where one constituent element is at some or predetermined distance away from another constituent element, one or more other constituent elements may be between them. In addition, in a case where one constituent element is "directly on another constituent element", or is "just on" another constituent element, another constituent element cannot be between them.

The terms first, second, and so on, may be used in order to describe various items, such as elements, areas, and/or portions, but do not impose any limitation to such items. It is noted that a second constituent does not presume that a first constituent is present.

Figure 3:
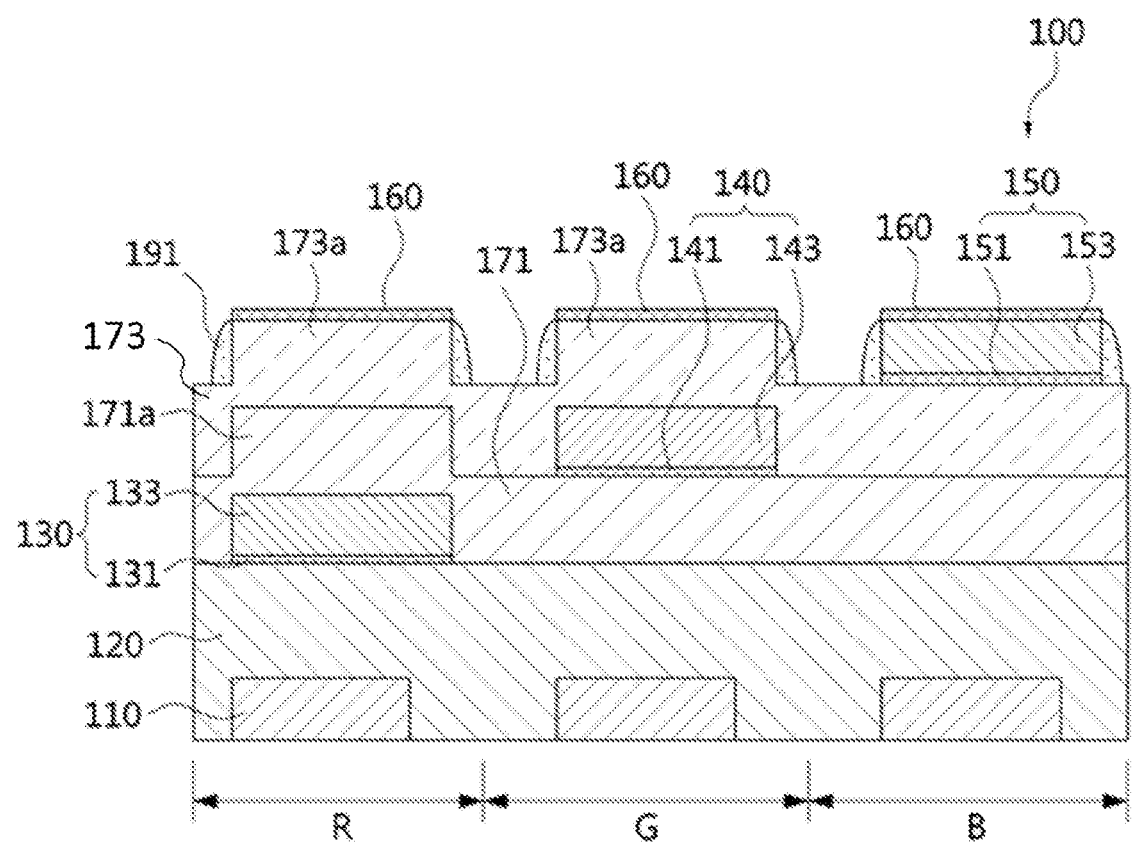
FIG. 3 is a cross-sectional diagram illustrating an exemplary organic light emitting display device according to various embodiments of the present invention.

FIG. 3 is a cross-sectional diagram illustrating an exemplary organic light emitting display device according to one or more embodiments of the present invention.

An organic light emitting display device 100 according to embodiments of the present invention will be described in detail below with reference to the accompanying drawings.

With reference to FIG. 3, the present invention relates to an organic light emitting display device 100. More particularly, the present invention relates to an organic light emitting display device 100 in which a sidewall of a reflective metal in a blue pixel region B is covered with an inorganic film. The inorganic film thus reduces or prevents damage, loss, or defects in the reflective metal during subsequent processes, such as etching and cleaning, to form an anode on.

The organic light emitting display device 100 according to embodiments of the present invention may include multiple pixel regions, for example, a red pixel region R, a green pixel region G, and a blue pixel region B. Specifically, in the organic light emitting display device 100 according to embodiments of the present invention may include, for example, a lower insulation layer (not illustrated) on a wafer (e.g., of elemental silicon) or other substrate (not illustrated). Source electrodes, drain electrodes, gate electrodes, and the like (e.g., as components of transistors; not shown) are on the wafer substrate, and these electrodes are insulated by and/or separated from the metal layer 110 by the lower insulation layer. A metal layer 110 (e.g., that connects electrodes of different transistors) is on the lower insulation layer. An interlayer insulation film 120 is on the lower insulation layer and covers the upper metal layer 110. The interlayer insulation film 120 may comprise an inorganic film, for example, a silicon nitride film, a silicon oxide film that may be doped with one or more of boron, phosphorous and fluorine, or a multi-layer film thereof. The upper metal layer 110 is insulated by the interlayer insulation film 120.

In addition, in the red pixel region R, a first reflective metal layer 130 may be on the interlayer insulation film 120. The first reflective metal layer 130 may include a first buffer electrode 131 and a first metal layer 133 that is on the first buffer electrode 131. The first buffer electrode 131 is between the interlayer insulation film 120 and the first metal layer 133. The first buffer electrode 131 may comprise titanium nitride (TiN) or may have a multi-layer structure comprising titanium nitride (TiN) and titanium (Ti). This configuration does not constitute a principal element of the present invention.

The first metal layer 133 may comprise silver (Ag), which has a high reflectance in the red wavelength band. Thus, the light emitting efficiency of the red pixel region R can be optimized by creating constructive interference of the emitted light. As will be described in detail below, because the microscopic resonance length of the red pixel region R is the longest, the first metal layer 133 of the first reflective metal layer 130 has a length greater than the distance between a cathode (not shown) and each of the second metal layer 143 of the second reflective metal layer 140 and the third metal 153 of the third reflective metal layer 150, which will be described below. Specifically, the distance between the first reflective metal layer 130 and the metal cathode is n (where n is an integer) times the average wavelength of red light.

In addition, a first insulation layer 171 is on the first reflective metal layer 130 and an exposed surface of the interlayer insulation film 120, covering the first reflective metal layer 130.

Then, in the green pixel region G, the second reflective metal layer 140 may be on the first insulation layer 171. The second reflective metal layer 140 may include a second buffer electrode 141 and the second metal layer 143 on the second buffer electrode 141. The second buffer electrode 141 is between the first insulation layer 171 and the second metal layer 143 and may comprise the same material as the first buffer electrode 131.

Then, the second metal layer 143 may also comprise silver (Ag), which has a high reflectance in the green wavelength band. Thus, the light emitting efficiency of the green pixel region G can be optimized by creating constructive interference of the emitted light. The microscopic resonance length of the green pixel region G is shorter than that of the red pixel region R and is greater than that of the blue pixel region B. Because of this, the second reflective metal layer 140 has a length shorter than the distance between the first reflective metal layer 130 and the cathode (not shown) and is greater than the distance between the third reflective metal layer 150 and the cathode.

In addition, a second insulation layer 173 is on the second reflective metal layer 140 and an exposed surface of the first insulation layer 171, covering the second reflective metal layer 140. Like the first insulation layer 171 and a third insulation layer 175 that will be described below, the second insulation layer 173 may be or comprise a silicon oxide film (which may be doped as described herein), a silicon nitride film, or a multi-layer film thereof.

In the blue pixel region B, the third reflective metal layer 150 is on the second insulation layer 173. The third reflective metal layer 150 may include a third buffer electrode 151 and the third metal layer 153 on the third buffer electrode 151. The third buffer electrode 151 may be between the second insulation layer 173 and the third metal 153.

The third metal layer 153 may comprise aluminum (Al), which has a high reflectance in a blue wavelength band. Thus, the light emitting efficiency of the blue pixel region B can be optimized by creating constructive interference of the emitted light. The microscopic resonance length of the blue pixel region B is the shortest of the three pixel regions R, G and B. Because of this, the third reflective metal layer 150 has a length smaller than the distance between the cathode (not shown) and each of the first reflective metal layer 130 and the second reflective metal layer 140. That is, the first, second, and third reflective metal layers 130, 140, and 150 have different heights, different distances from the substrate, and different distances from the cathode.

An anode 160 is on an upper surface of the third reflective metal layer 150. Other anodes 160 are also on protrusions 173a in the second insulation layer 173. The anodes 160 may comprise a transparent conductive material. A protective film 191 is on exposed sidewalls of the third reflective metal layer 150, as well as on sidewalls of the second insulation layer 173. For example, the protective film 191 may comprise an inorganic film (e.g., a silicon nitride film).

In addition, second protrusions 173a in the red and green pixel regions R and G protrude upward from the second insulation layer 173 and have substantially the same shape as the third reflective metal layer 150. The anodes 160 that supply holes to the pixels are on the respective upper surfaces of the individual protrusions 173a and the third metal layer 131. The anodes 160 may comprise a transparent conductive material. However, no particular limitation is imposed. The anodes 160 are a predetermined distance in the horizontal direction away from each other over the substrate, and thus may define respective individual pixel regions. In a case where a gate signal on a gate line is input into an individual transistor on the substrate, the individual transistor may output a voltage to a first electrode (not shown). In one example, the voltage output from the individual transistor may be according to a data voltage of a data line.

Then, an organic light emitting layer and a cathode (not illustrated, but which is an electrode common to all three pixels R, G and B) may be on the second insulation film 173. However, for brevity, descriptions of the organic light emitting layer and the cathode are omitted.

Problems with a conventional method of manufacturing an organic light emitting diode 900, a structure of the present invention for solving the problems, and advantages thereof will be described in detail below.

Figure 1:
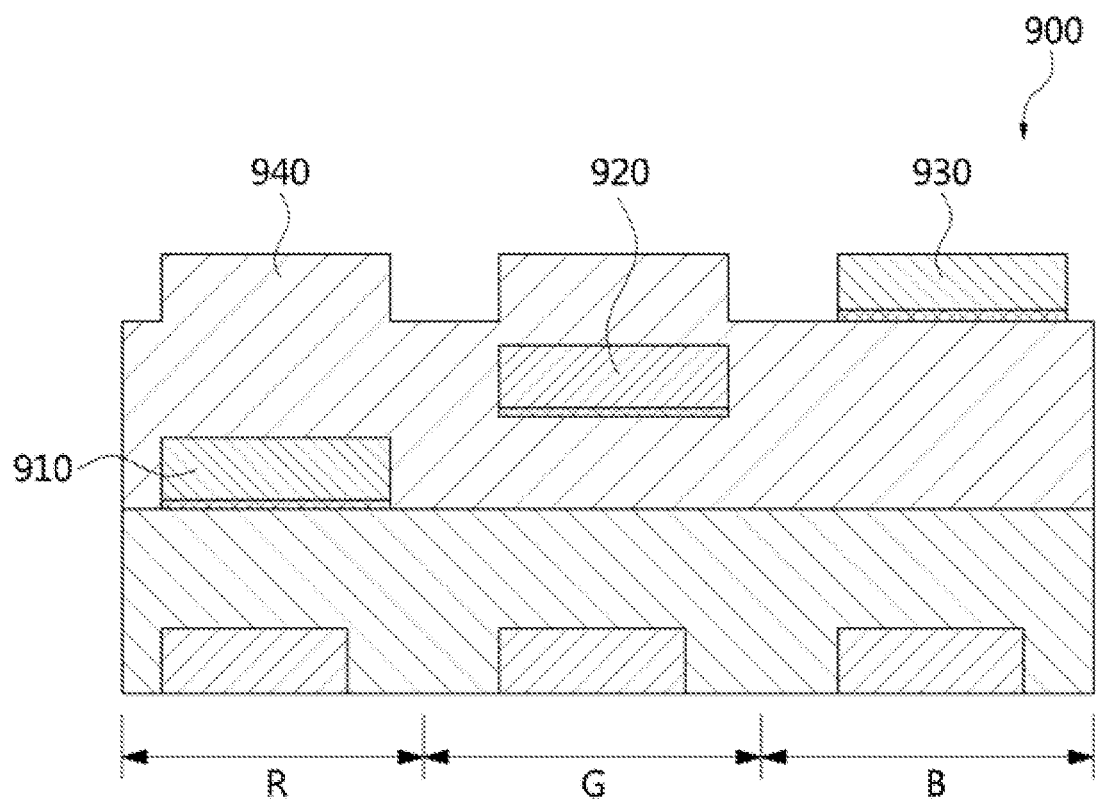
FIGS. 1 and 2 are reference diagrams for describing a loss of a reflective metal in a blue pixel region in steps of manufacturing a conventional organic light emitting display device in the related art.
Figure 2:
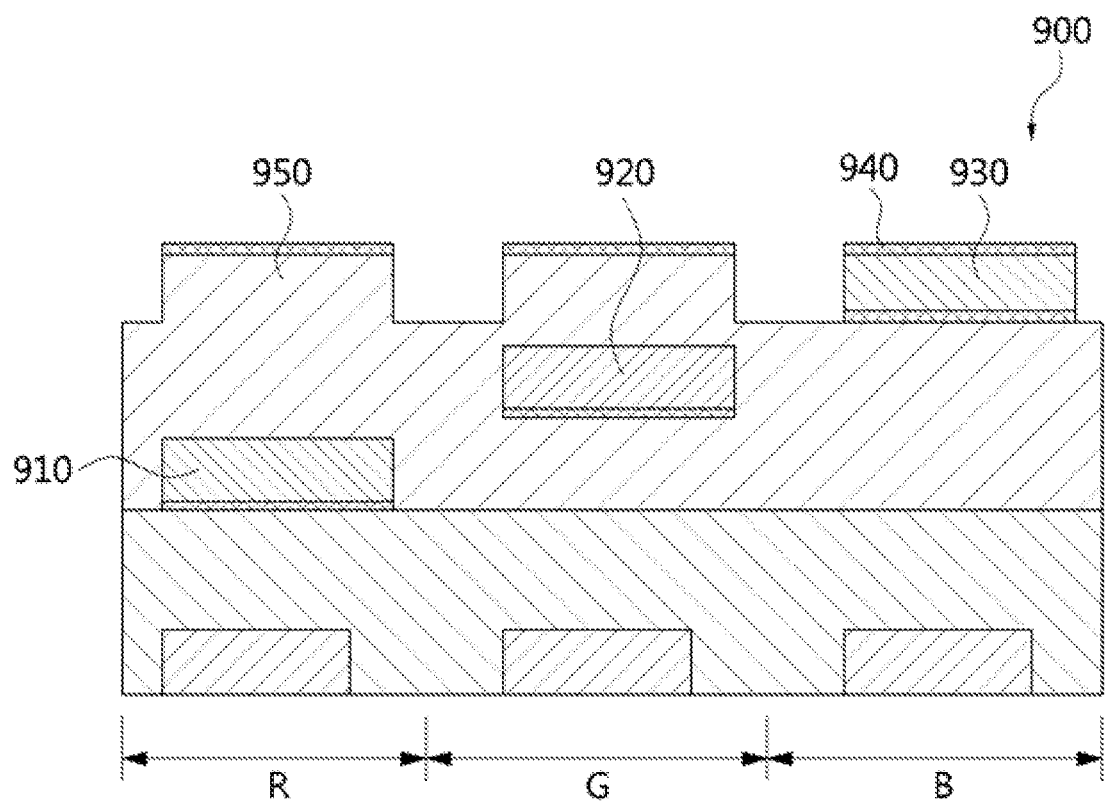

With reference to FIGS. 1 and 2, in steps of manufacturing the organic light emitting diode 900 in the related art, a first reflective metal 910 in the red pixel region R, a second reflective metal 920 in the green pixel region G, and a third reflective metal 930 in the blue pixel region B have different heights. That is, the first reflective metal 910 is first formed, and the second reflective metal 920 is a greater distance from the substrate than the first reflective metal 910. Subsequently, the second reflective metal 920 is covered with an insulation film 950, and then, the third reflective metal 930 is on an insulation film 950 in the blue pixel region B.

Specifically, for the formation of the third reflective metal 930, for example, an aluminum metal layer is deposited on the insulation film 940, patterning and etching processes are next performed, and a cleaning process is then performed. Subsequently, titanium nitride (TiN) for forming the anode 940 is deposited (e.g., on the third reflective metal 930), then patterned and etched, such that the resulting TiN layer has substantially the same size as the third reflective metal 930, and a cleaning process is then performed. During these processes, when $Cl_2$, which is used to etch the titanium nitride layer, reacts with $H_2O$, which is used to clean the third reflective metal 930 and the titanium nitride layer, HCl is generated, resulting in the third reflective metal 930 being damaged or rendered defective. This can cause a decrease in the light emitting efficiency of the device.

With reference to FIG. 3, in order to solve this problem, according to the present invention, a protective film 191 is on exposed sidewalls of the third reflective metal layer 150. This provides the advantage of protecting the third reflective metal layer 150 from $H_2O$ or potentially reactive species such as HCl in the manufacturing process. The formation of the protective film 191 in an exemplary method of manufacturing the organic light emitting display device will be described in more detail below.

FIGS. 4 to 8 are cross-sectional diagrams illustrating intermediate structures formed in a method of manufacturing an exemplary organic light emitting display device according to embodiments of the present invention.

An exemplary method of manufacturing the organic light emitting display device according to embodiments of the present invention will be described in detail below with reference to the accompanying drawings.

Figure 4:
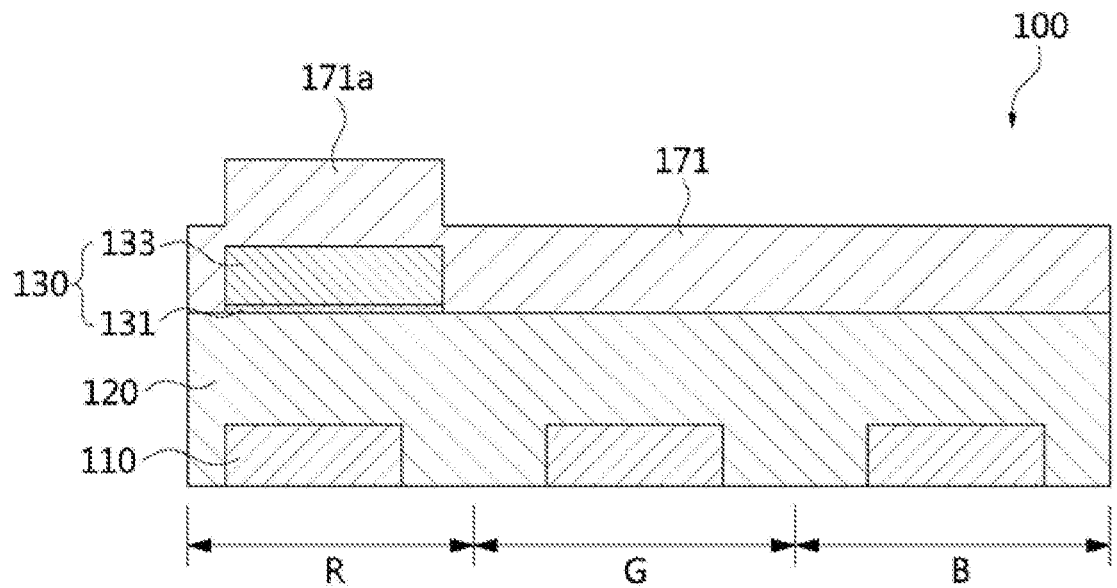
FIGS. 4 to 9 are diagrams illustrating a method of manufacturing the exemplary organic light emitting display device according to various embodiments of the present invention.

First, with reference to FIG. 4, the interlayer insulation film 120 is deposited on a lower insulation layer (not shown) and the upper metal layer 110 to cover the upper metal layer 110. The method may further comprise forming the upper metal layer 110 on the lower insulation film in each pixel region. The interlayer insulation film 120 may comprise an inorganic film, for example, a silicon nitride film, a silicon oxide film (which may be doped as described herein), or a multi-layer film thereof. In addition, after the interlayer insulation film 120 is deposited, a process of planarizing an upper surface thereof may be performed. The planarization process, for example, may be or comprise a chemical-mechanical planarization or chemical-mechanical polishing (CMP) process.

Subsequently, in the red pixel region R, a metal layer for forming the first reflective metal layer 130 is deposited on the interlayer insulation film 120, and is then patterned and etched. For example, a metal layer that comprises elemental titanium or a multiple-layered structure comprising titanium nitride and titanium is deposited on the interlayer insulation film 120, and then, for example, a metal layer comprising silver is deposited thereon. Subsequently, the metal layers are patterned and etched to form the first buffer electrode 131 and the first metal layer 133. The first buffer electrode 131 and the second and third buffer electrodes 141 and 151 (see, e.g., FIGS. 3, 5 and 7) will be described below. It is noted that, in a case where the buffer electrodes are not present, the metal layers 133, 143, and 153 may be formed directly on the interlayer insulation film 120, the first insulation layer 171, and the second insulation layer 173, respectively.

Then, an insulation layer is deposited on the first reflective metal layer 130 and the exposed interlayer insulation film 120, and then is optionally patterned and etched, to form the first insulation layer 171. In the red pixel region R, as illustrated, for example, a first protrusion 171a may be formed that protrudes upward in a manner that has substantially the same size as the first reflective metal layer 130. The first protrusion 171a is a given distance away from the adjacent second reflective metal layer 140 formed in subsequent processes. A portion of the first insulation layer 171 underneath the first protrusion 171a and the remaining portion of the first insulation layer 171 extends substantially in the horizontal direction.

Figure 5:
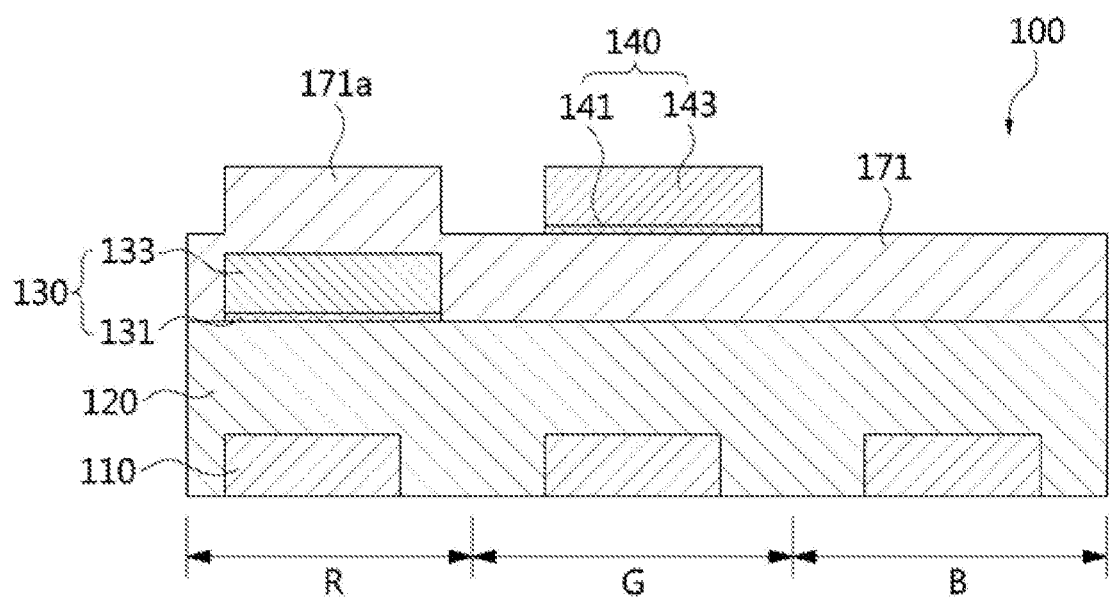

Substantially, with reference to FIG. 5, in the green pixel region G, a metal layer for forming the second reflective metal layer 140 is deposited on the first insulation layer 171, and is then patterned and etched. The second reflective metal layer 140 may be formed in the same manner as the first reflective metal layer 130. Thus, a detailed description thereof is omitted.

Figure 6:
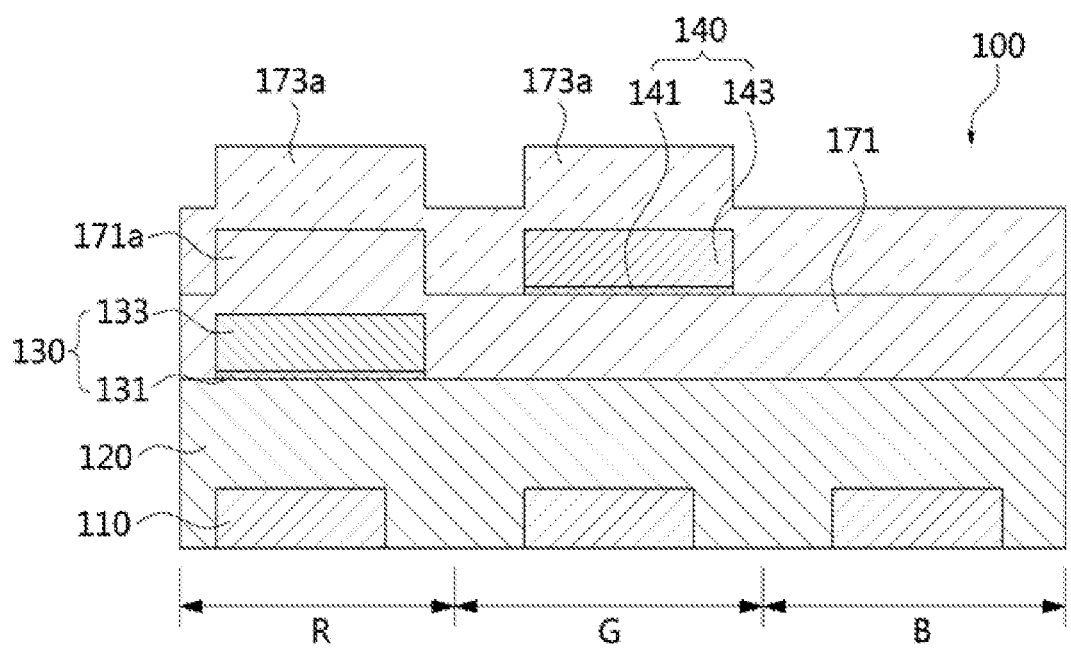

Then, with reference to FIG. 6, an insulation layer is deposited on the second reflective metal layer 140 and an exposed portion of the first insulation layer 171, and is optionally patterned and etched, to form the second insulation layer 173. In the red pixel region R and the green pixel region G, as illustrated, for example, second protrusions 173a may be formed that protrude upward and have substantially the same size as the first reflective metal layer 130 or the second reflective metal layer 140. The adjacent second protrusions 173a are a predetermined horizontal distance away from each other.

Figure 7:
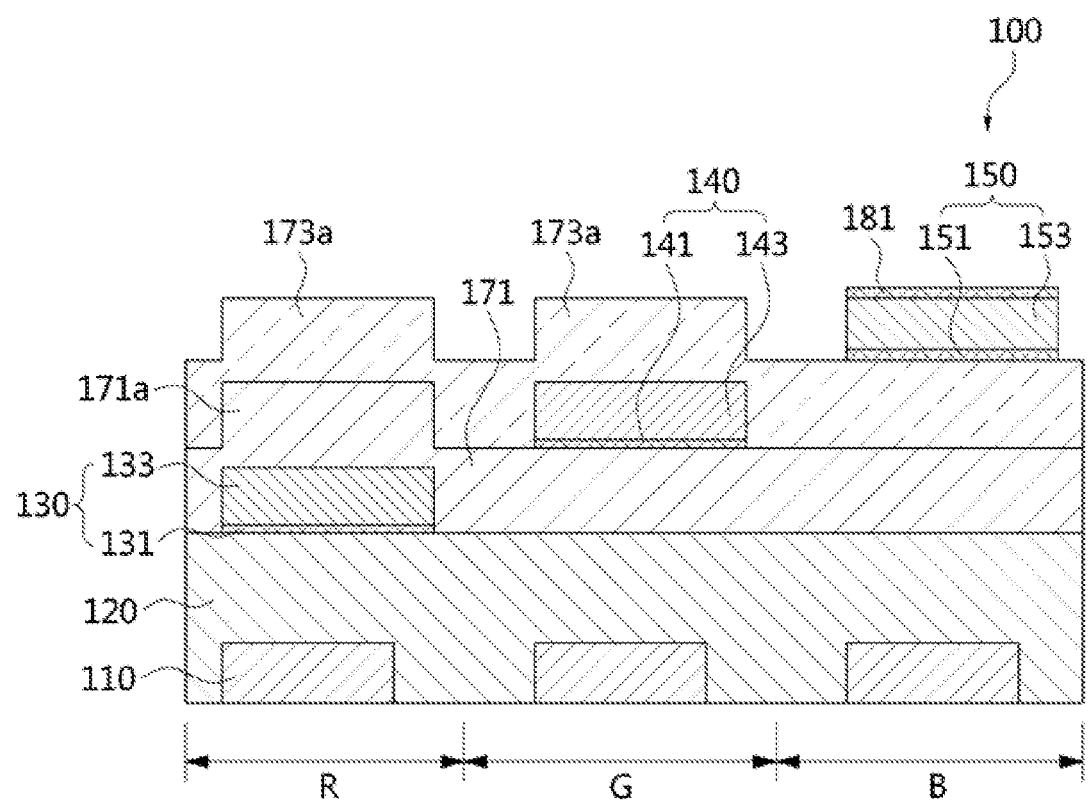

Then, with reference to FIG. 7, in the blue pixel region B, the third reflective metal layer 150 is formed on the second insulation layer 173. The third metal 153 of the third reflective metal layer 150 may comprise elemental aluminum or an aluminum alloy (e.g., with titanium and/or silicon). First, for example, a metal layer comprising elemental titanium or a multiple-layer structure comprising titanium nitride and titanium may be deposited on the second insulation layer 173, and then, for example, a metal layer comprising aluminum may be deposited on the titanium-containing metal layer. In addition, for example, a layer comprising titanium nitride is formed on the metal layer from which the second metal layer 153 is formed.

In addition, the layer comprising titanium nitride, the metal layer comprising aluminum, and the titanium-containing metal layer are patterned and etched to form the third reflective metal layer 150 and a protective layer 181 on an upper surface of the third reflective metal layer 150. The protective layer 181, for example, may comprise the same material (e.g., titanium nitride) as the anode 160 to be subsequently formed. In this manner, the upper surface of the third metal 153 is covered with the protective layer 181. Thus, when performing a cleaning process after etching the third reflective metal layer 150, the upper surface of the third metal 153 can be prevented from coming into direct contact with $H_2O$, HCl or the like. In addition, the protective layer 181, which comprises the same material as the anode 160, can have a relatively smaller thickness than the anode 160. Because of this, the anode 160 can be formed on the protective layer 181 without needing to remove the protective layer 181 when subsequently forming the anode 160. Therefore, the number of processes can be reduced.

Figure 8:
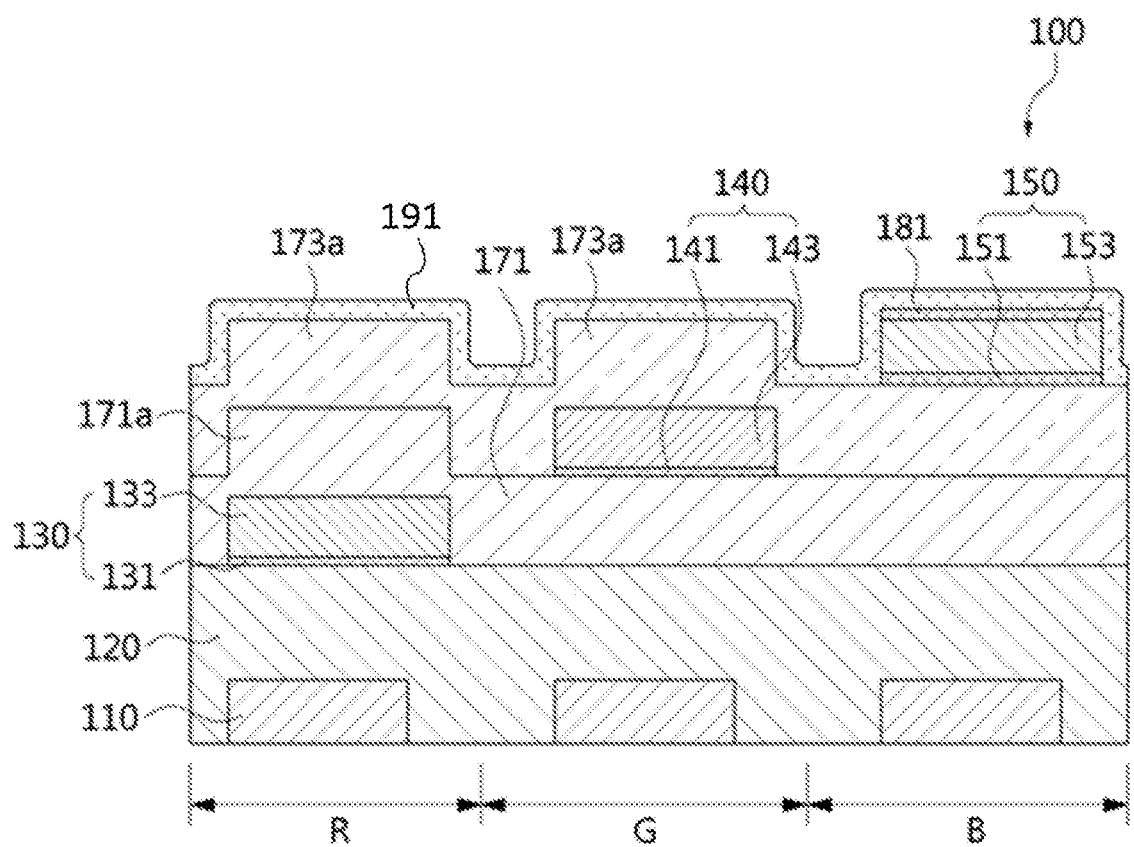
Figure 9:
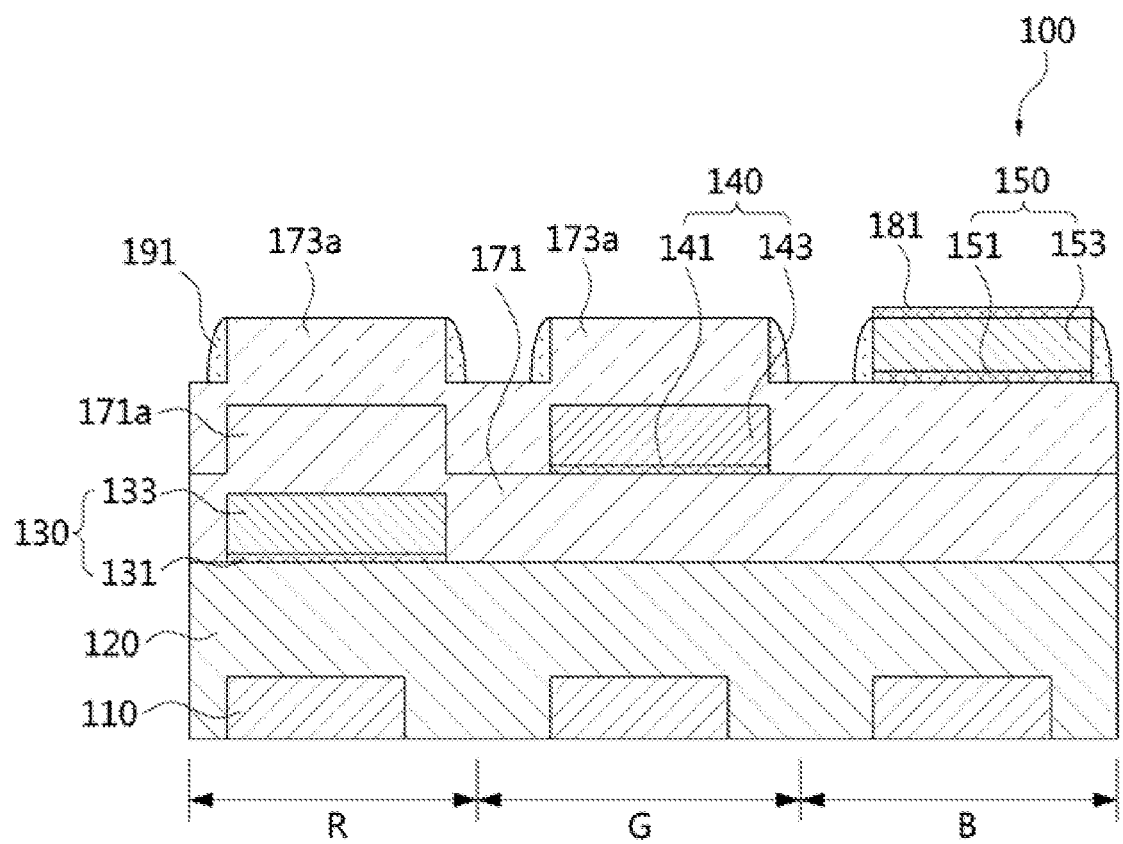

Then, with reference to FIGS. 8 and 9, in order to prevent exposed sidewalls of the third metal layer 153 from coming into direct contact with $H_2O$, HCl or the like in a subsequent cleaning process, a layer for the protective film 191 is conformally blanket-deposited on the second insulation layer 173 including the second protrusions 173a, the third metal 153 and the protective layer 181. The protective film 191, for example, may be or comprise an inorganic material, such as silicon nitride.

With reference to FIGS. 8 and 9, the layer for the protective film 191 may cover the sidewalls of the third metal 153. The layer for the protective film 191 is then etched. The layer for the protective film 191 may be etched by reactive ion etching (RIE), thereby forming the protective film 191 on the sidewalls of the third metal 153, as shown in FIG. 9.

Subsequently, with reference to FIG. 9, the anode 160 is formed on the second protrusions 173a and the protective layer 181. Because the protective layer 181 includes the same material as the first electrode, a separate process of removing the protective layer 181 is unnecessary. Therefore, this provides the advantage that the number of processes may be reduced.

The present invention is described in detail above in an illustrative manner. In addition, the above description is provided to explain various embodiments of the present invention, and various different combinations of, and various modifications to, the present invention may be made under various environments. Modifications or alterations to the invention are possible within the scope of the concept of the invention disclosed in the present specification, the scope of equivalents of the contents of the described disclosure, and/or the scope of the technology or knowledge in the art. Optimal requirements for realizing the technical idea of the present invention may be described for the embodiments. Various modifications that may be required in the field(s) in which the present invention finds application and that may use the present invention are possible as well. Therefore, the above detailed description relating to the invention is not intended to impose any undisclosed limitation to the disclosed embodiments.

What is claimed is:

1. An organic light emitting display device having reflective metal layers on different levels above red, green and blue pixel regions comprising:
    an interlayer insulation film covering an upper metal layer on a lower insulation layer;
    a first reflective metal layer in a red pixel region on the interlayer insulation film;
    a first insulation layer on the first reflective metal layer and an exposed surface of the interlayer insulation film;
    a second reflective metal layer in a green pixel region on the first insulation layer;
    a second insulation layer on the second reflective metal layer and an exposed surface of the first insulation layer;
    a third reflective metal layer in a blue pixel region on the second insulation layer;
    an inorganic protective film on a sidewall of the third reflective metal layer; and
    anodes on second protrusions and an upper surface of the third reflective metal layer, wherein
        the first insulation layer includes a first protrusion in the red pixel region protruding upward from the first reflective metal layer,
        the second insulation layer includes the second protrusions protruding upward from the first protrusion and the second reflective metal layer, respectively, and
        the anodes on the second protrusions and the upper surface of the third reflective metal layer, respectively, and having a substantially same height or distance from the lower insulation layer.

2. The organic light emitting display device according to claim 1, wherein
    each of the first to third reflective metal layers includes a buffer electrode and a metal layer on the buffer electrode, and
    the third reflective metal layer comprises aluminum.

3. The organic light emitting display device, according to claim 1, wherein
    the first to third reflective metal layers have different heights or distances from the lower insulation layer.

4. A method of manufacturing an organic light emitting display device having reflective metal layers on different levels above red, green and blue pixel region, the method comprising:
    depositing an interlayer insulation film on an upper metal layer in each pixel region, the upper metal layer being on a lower insulation film;
    forming a first reflective metal layer on the interlayer insulation film in a red pixel region;
    forming a first insulation layer on the first reflective metal layer and an exposed surface of the interlayer insulation film;
    forming a second reflective metal layer on the first insulation layer in a green pixel region;
    forming a second insulation layer on the second reflective metal layer and an exposed surface of the first insulation layer;
    forming a third reflective metal layer on the second insulation layer in a blue pixel region;
    covering an upper surface of the third reflective metal layer with a protective layer that comprises a metal material; and
    forming an anode on the protective layer on the upper surface of the third reflective metal layer, wherein
        the protective layer and the anode comprise a same material, and
        the protective layer has a smaller thickness than the anode.

5. The method according to claim 4, further comprising covering a sidewall of the third reflective metal layer with a protective film.

6. The method according to claim 5, wherein
    covering the sidewall of the third reflective metal layer with the protective film comprises depositing an inorganic film layer on the third reflective metal layer and an exposed surface of the second insulation layer, and then removing part of the inorganic film layer by anisotropic etching.

7. A method of manufacturing an organic light emitting display device having reflective metal layers on different levels above red, green and blue pixel region, the method comprising:
    depositing an insulation film on an upper metal layer in each pixel region, the upper metal layer being on a lower insulation film;
    forming a first reflective metal layer in a red pixel region, a second reflective metal layer in a green pixel region, and a third reflective metal layer in a blue pixel region having different heights by forming a first insulation layer, and a second insulation layer on the first insulation layer;
    covering an upper surface of the third reflective metal layer with a protective layer that is relatively higher than the first reflective metal layer and the second reflective metal layer;
    depositing an inorganic film layer on an upper exposed surface of the second insulation layer, the third reflective metal layer, and the protective layer; and
    forming a protective film on a sidewall of the third reflective metal layer by anisotropically etching the inorganic film layer.

8. The method according to claim 7, further comprising:
    depositing a metal layer on the protective layer, the metal layer comprising a same material as the protective layer; and forming an anode by patterning and etching the metal layer.

9. The method according to claim 8, wherein the protective layer has a smaller thickness than the anode.

10. The method according to claim 8, wherein forming the anode comprises etching and cleaning the metal layer.

\* \* \* \* \*